US008373491B2

(12) United States Patent
Van Den Bos et al.

(10) Patent No.: US 8,373,491 B2

(45) Date of Patent: Feb. 12, 2013

(54) SWITCHED CURRENT MIRROR WITH GOOD MATCHING

(75) Inventors: Norbert Van Den Bos, Wijchen (NL); Roeland Heijna, Nijmegen (NL); Hendrik Visser, Wijchen (NL)

(73) Assignee: ST-Ericsson SA, Plan-les-Ouates (CH)

( * ) Notice: Subject to any disclaimer, the term of this patent is extended or adjusted under 35 U.S.C. 154(b) by 155 days.

(21) Appl. No.: 13/046,864

(22) Filed: Mar. 14, 2011

(65) Prior Publication Data

US 2012/0081174 A1 Apr. 5, 2012

Related U.S. Application Data

(60) Provisional application No. 61/388,326, filed on Sep. 30, 2010.

(51) Int. Cl.
*H03K 17/00* (2006.01)

(52) U.S. Cl. ........ 327/403; 327/404; 330/288; 323/315; 323/316

(58) Field of Classification Search .......... 327/403–404; 330/288; 323/315, 316
See application file for complete search history.

(56) References Cited

U.S. PATENT DOCUMENTS

| | | | | |
|---|---|---|---|---|
| 4,608,530 | A * | 8/1986 | Bacrania | 323/315 |
| 5,939,933 | A * | 8/1999 | Wang | 327/512 |
| 6,166,670 | A | 12/2000 | O'Shaughnessy | |
| 6,462,527 | B1 * | 10/2002 | Maneatis | 323/315 |
| 7,034,610 | B2 | 4/2006 | Jantzi | |
| 7,466,202 | B2 * | 12/2008 | Karthaus et al. | 330/288 |
| 7,636,014 | B1 * | 12/2009 | Chen | 330/254 |
| 2007/0229150 | A1 | 10/2007 | Galal | |
| 2008/0007351 | A1 | 1/2008 | Chiu et al. | |
| 2008/0024205 | A1 | 1/2008 | Lee | |
| 2008/0143429 | A1 | 6/2008 | Mizuki | |
| 2009/0125420 | A1 | 5/2009 | Zhang | |

FOREIGN PATENT DOCUMENTS

| | | | |
|---|---|---|---|
| CN | 11498949 | A | 8/2009 |
| CN | 11530175 | A | 1/2010 |
| JP | 2004336164 | A | 11/2004 |

* cited by examiner

*Primary Examiner* — Kenneth B. Wells

(74) *Attorney, Agent, or Firm* — Coats & Bennett, P.L.L.C.

(57) ABSTRACT

A current mirror circuit exhibits improved current matching by applying a switching signal to ground path switches in series with transistors in both a reference path and an output path of the current mirror. The switching signal may comprise a high-frequency signal, which may be phase modulated. A plurality of matched, parallel-connected output transistors may be selectively enabled by qualifying the switching signal applied to each corresponding series-connected ground path switches by decoded digital modulation data. In one embodiment, the modulation data is decoded to thermometer-coded representation. In one embodiment, the switching signal path is identical to the reference and output circuits.

22 Claims, 5 Drawing Sheets

SWITCHED CURRENT MIRROR WITH GOOD MATCHING

PRIORITY CLAIM

This application claims priority to U.S. Provisional Patent Application Ser. No. 61/388,326, titled "Switched Current Mirror with Good Matching," filed Sep. 30, 2010, the disclosure of which is incorporated herein by reference in its entirety.

BACKGROUND

A current mirror is a well-known circuit designed to copy a current through one active device (such as a transistor) by controlling the current in another active device, keeping the output current constant regardless of loading. The output current may be applied to a different node than the input current, and has a current ratio (with respect to the reference current) set by the ratio of input and output transistors used.

The transistor size ratio, and hence the current ratio, may be altered by connecting a plurality of output transistors in parallel. By adding switches in series with the parallel-connected output transistors, the number of output transistors active in the current mirror at any given moment can be changed by controlling the switches, and in this manner the current ratio can be dynamically controlled. When the switches are controlled by digital signals, the analog output current can be digitally controlled, acting like a Digital to Analog Converter (DAC).

FIG. 1 depicts a current mirror in which the active devices are NMOS transistors $M_1$ and $M_2$. Due to $R_1$, current $I_1$ flows through the reference transistor $M_1$, causing a gate-source voltage $V_{gs1}$. The gate-source voltage $V_{gs2}$ for output NMOS transistor M2 is the same ($V_{gs1}=V_{gs2}$), resulting in current $I_2$ when the transistor $M_4$, acting as a switch, is in a conducting state. This occurs when the switch $S_1$ is in the upper position, placing a high voltage on the gate of $M_4$. Transistor $M_3$ in series with reference transistor $M_1$ also acts as a switch, which is always "on," as its gate terminal is tied high. When switch $S_1$ is in the lower position, switch $M_4$ is non-conducting, or open, causing current $I_2$ to go to zero. Accordingly, the switch $S_1$ controls current $I_2$ to be either proportional to $I_1$ or zero.

Currents $I_1$ and $I_2$ are nearly equal when the reference transistor $M_1$ and output transistor $M_2$ have equal layout, and switching transistors $M_3$ and $M_4$ are also the same (indeed, $M_3$ exists only for such path matching, as it is always in an "on" state), and of course $R_1=R_2$. In this case, if $S_1$ switches to apply a pulse train on the gate of $M_4$ having a 50% duty cycle, the current ratio $I_2/I_1$ is one half (½). Both the frequency and the pulse-width of the switching signal applied to the gate of $M_4$ will influence this current ratio. Switching speed and pulse-width are influenced by product junction temperature and by production process spread, which cause an unacceptably large spread on the output current $I_2$. Some of this spread can be compensated by a feedback system. However, measuring a high-frequency switching signal has limited accuracy, limiting the performance of such a feedback system.

SUMMARY

A current mirror circuit exhibits improved current matching by applying a switching signal to ground path switches in series with transistors in both a reference circuit and an output circuit of the current mirror. The switching signal may comprise a high-frequency signal, such as a Radio Frequency (RF) carrier, which may be phase modulated. A plurality of matched, parallel-connected output transistors may be selectively enabled by qualifying the switching signal applied to each corresponding series-connected ground path switch by decoded digital modulation data. In one embodiment, the modulation data is decoded to thermometer-coded representation. In one embodiment, the switching signal path is substantially identical to the reference and output circuits.

One embodiment relates to a high-frequency, modulating current mirror circuit. The circuit includes a reference transistor diode-connected between an output power controller and a switched path to signal ground. The circuit further includes a plurality of output transistors connected in parallel between a common load and independent switched paths to signal ground, wherein the gates of the output transistors are all connected to the gate of the reference transistor. The circuit also includes a high-frequency input operative to receive a high-frequency signal, and a digital decoder operative to receive and decode a digital modulation code. A plurality of logic functions are associated with the plurality of output transistors. Each logic function is operative to receive the high-frequency signal and a bit of the decoded modulation code. The output of each logic function is operative to control the respective ground path switch of an output transistor.

Another embodiment relates to a method of modulating a high-frequency signal in a current mirror circuit. A current through a diode-connected reference transistor is controlled by selectively coupling the transistor to signal ground via a switch controlled by a high-frequency signal. The current through some of a plurality of output transistors connected in parallel and having a common load is selectively controlled by selectively coupling some of the transistors to signal ground via respective switches controlled by the high-frequency signal and a digital modulation code, wherein the gates of the output transistors are all connected to the gate of the reference transistor.

DETAILED DESCRIPTION

Figure 1:
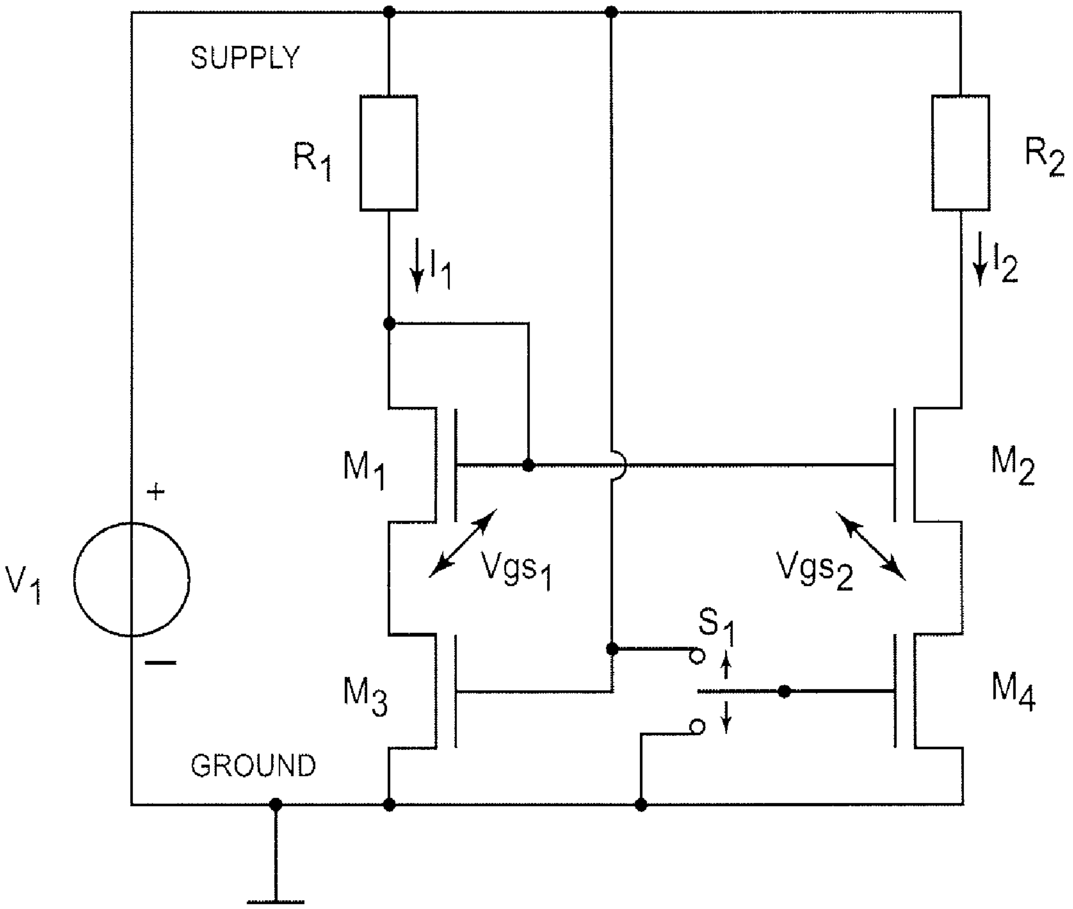
FIG. 1 (PRIOR ART)
FIG. 1 is a schematic diagram of a prior art current mirror circuit.
Figure 2:
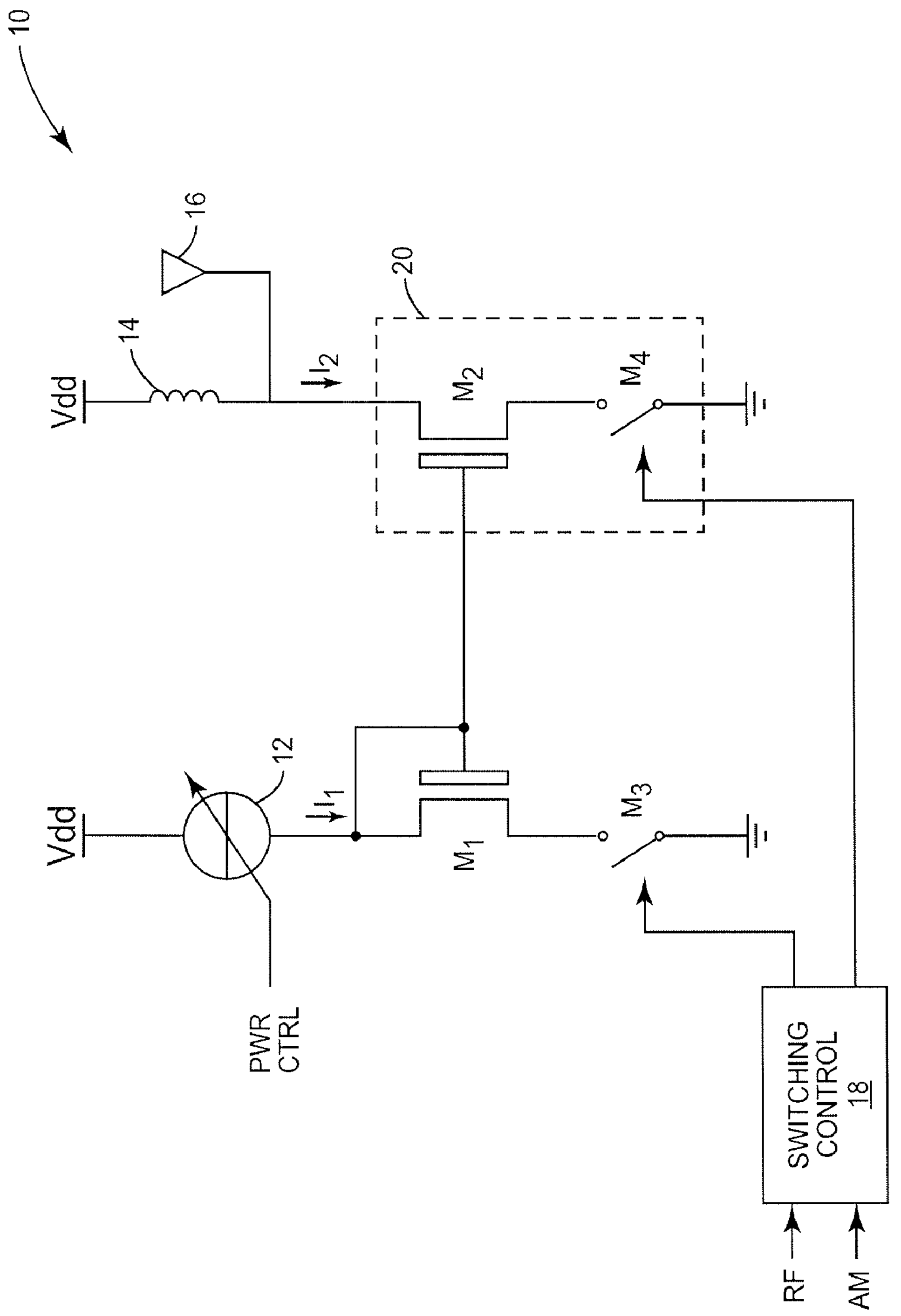
FIG. 2 is a functional schematic diagram of a current mirror circuit according to one embodiment of the present invention.

FIG. 2 depicts an improved current mirror circuit 10, in which the transistor notation from the prior art circuit of FIG. 1 is retained for clarity of explanation. Note that while the transistors depicted are NMOSFETs, this is not a limitation of the present invention, and other transistor types may be utilized. The current mirror circuit 10 is configured as a Radio Frequency (RF) amplifier. The output power is controlled by a linear power control circuit 12 in the reference circuit, controlling the current $I_1$ through diode-connected reference transistor $M_1$ and an associated, series-connected ground path switch $M_3$. As known in the art, a diode-connected transistor is a transistor having a short circuit between the gate and drain nodes. As in the prior art, the gate connection of output transistor $M_2$ to reference transistor $M_1$ causes a gate-source voltage equality ($V_{gs1}=V_{gs2}$), resulting in a proportional current $I_2$ flowing through the output transistor $M_2$ and its series-connected ground path switch $M_4$. An inductive load 14 drives an output signal to an antenna 16.

In the current mirror circuit 10, both ground path switches $M_3$ and $M_4$ are controlled by a signal generated from switching control function 18. In general, the switching signal is a high-frequency signal (e.g., RF) with limited rise/fall times and unknown duty cycle, due to variations in temperature, processing, and the like. By applying the switching signal to both the reference circuit ground path switch $M_3$ and the output circuit ground path switch $M_4$, matching between the reference current $I_1$ and output current $I_2$ is maintained, as variations in the switching signal are applied equally to both sides of the current mirror. When $M_2$ and $M_4$ are matched to $M_1$ and $M_3$, respectively, and the same switching signal is applied to $M_3$ and $M_4$, then $I_2=I_1$.

In the circuit of FIG. 2, the output current $I_2$, and hence the current ratio $I_2/I_1$, can be scaled by altering the effective size of output transistor $M_2$ relative to reference transistor $M_1$—such as by connecting two or more output transistors in parallel. By independently switching the parallel output transistors $M_2$ in and out of the circuit, the current ratio $I_2/I_1$ can be dynamically controlled. This requires a separate ground path switch $M_4$ for each parallel-connected output transistor $M_2$. Aside from the ability to independently enable the output transistors $M_2$—that is, even for a fixed current ratio configuration—each output transistor $M_2$ should be connected in series with a ground path switch $M_4$, as the series resistance of switches $M_3$ and $M_4$ influence the mirror matching.

In one embodiment utilizing parallel output transistors, the RF amplifier of FIG. 2 implements a polar modulator, suitable for use in e.g. a Bluetooth® transmitter. In this embodiment, the output circuit 20, comprising an output transistor M2 and series-connected ground path switch $M_4$, may be replicated and connected in parallel, with the transistors being selectively switched in and out of the output circuit 20 to dynamically vary the current ratio $I_2/I_1$. In particular, phase information is modulated onto a 2.45 GHz carrier signal, represented by the RF input to the switching control function 18. This RF signal is used to control the switching of all ground path switches $M_3$, $M_4$. A binary Amplitude Modulation (AM) code, also input to the switching control function 18, is decoded and separate bits applied to the parallel output ground path switches $M_4$, along with the phase-modulated RF carrier.

Figure 3:
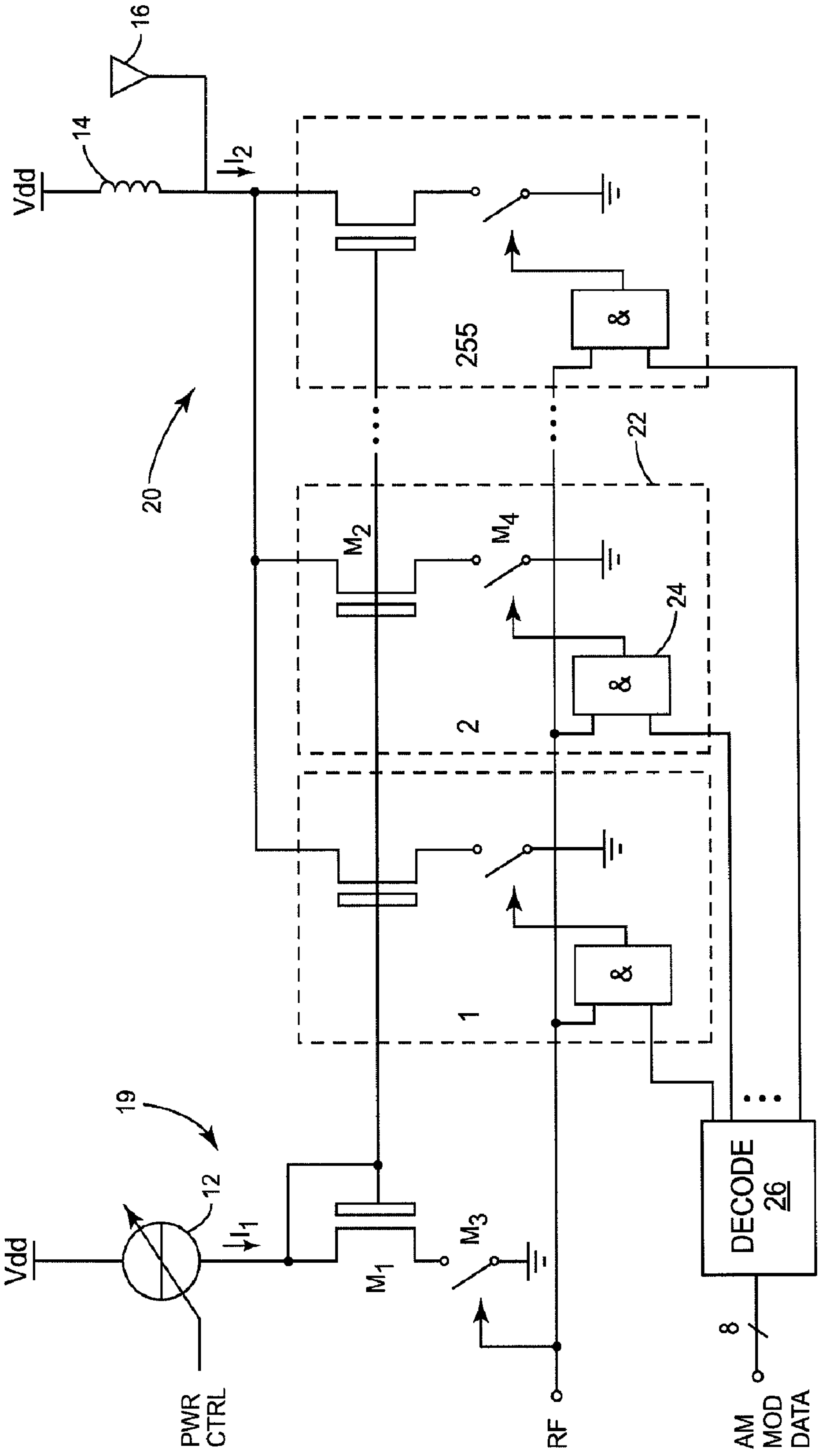
FIG. 3 is a functional schematic diagram of a current mirror circuit having a plurality of output transistor cells, according to one embodiment of the present invention.

This amplifier circuit is depicted in greater detail in FIG. 3. A linear power control circuit 12 in the reference circuit 19 controls the output power of the signal applied to the load 14 and antenna 16, by controlling the voltage applied to a diode-connected reference transistor $M_1$. This determines the current $I_1$ in the reference circuit 19, which is mirrored by currents summing to $I_2$ in the output circuit 20. The output circuit 20 of the current mirror comprises a plurality of parallel-connected output cells 22 (in one embodiment, 255 output cells 22). Each output cell 22 includes an output transistor $M_2$ gate-connected to the reference transistor $M_1$, a series-connected ground path transistor $M_4$ configured to function as a switch, and a logic function 24 applying a switching signal to the ground path switch $M_4$.

The output cells 22 are component-matched to each other. Additionally, the output transistor $M_2$ and ground path switching transistor $M_4$ are matched to the reference transistor $M_1$ and ground path switching transistor $M_3$, respectively. As used herein, component-matched means that the physical size of active features, wire lengths, layout, environment, and the like, of the cells implemented in an integrated circuit (IC) are as closely matched as possible. One known method of component matching is to create a representative circuit, such as an output cell 22, in a library, and "instantiate" or create multiple instances of the same library cell on an IC chip, to create the plurality of actual, component-matched cells 22.

A decoder 26 receives binary AM data, such as in 8-bit bytes. The decoder decodes the 8-bit AM data into, e.g., 255 thermometer-coded bits. One such bit is applied to the logic function 24 of each corresponding output cell 22. A phase-modulated RF carrier signal is applied to the other input of the logic function 24. In one embodiment (e.g., where the decoder 26 output is positive logic), each logic function 24 implements a logical AND between the respective decoded AM bit and the RF carrier signal. In this case, the RF carrier signal is applied to the gate of the ground path switching transistor $M_4$ in each output cell 22 when the corresponding decoded AM bit is a logical one. The RF carrier signal is also applied to the gate of the ground path switching transistor $M_3$ in the reference circuit 19. Thus, for each output cell 22 having a corresponding "enabled" decoded AM bit, the current in the cell 22 matches that through the reference transistor $M_1$. Because the output cells 22 are connected in parallel, these currents sum at the output 14. For each output cell 22 for which the corresponding decoded AM bit is a logical zero, the ground path switch $M_4$ is open, and no current flows in the cell 22. Thus, the output current applied to the load 14 has an amplitude determined by the digital AM modulation code. In particular, the output current is an integral multiple of the reference current, the multiplier being the number of enabled output cells 22.

Note that the provision of 255 output cells 22, and decoding the 8-bit AM data into a thermometer-coded representation, provides the greatest granularity of control, as amplitude of the sum output current $I_2$ may assume any of 255 values. However, this is not a limiting feature of the present invention. In other embodiments, a different digital coding or a combination of codes (e.g., a combination of binary and thermometer codes) may be utilized. This may reduce silicon area of the current mirror circuit by providing fewer than 255 output cells 22, with some loss of granularity of control of the output current $I_2$ amplitude.

Figure 4:
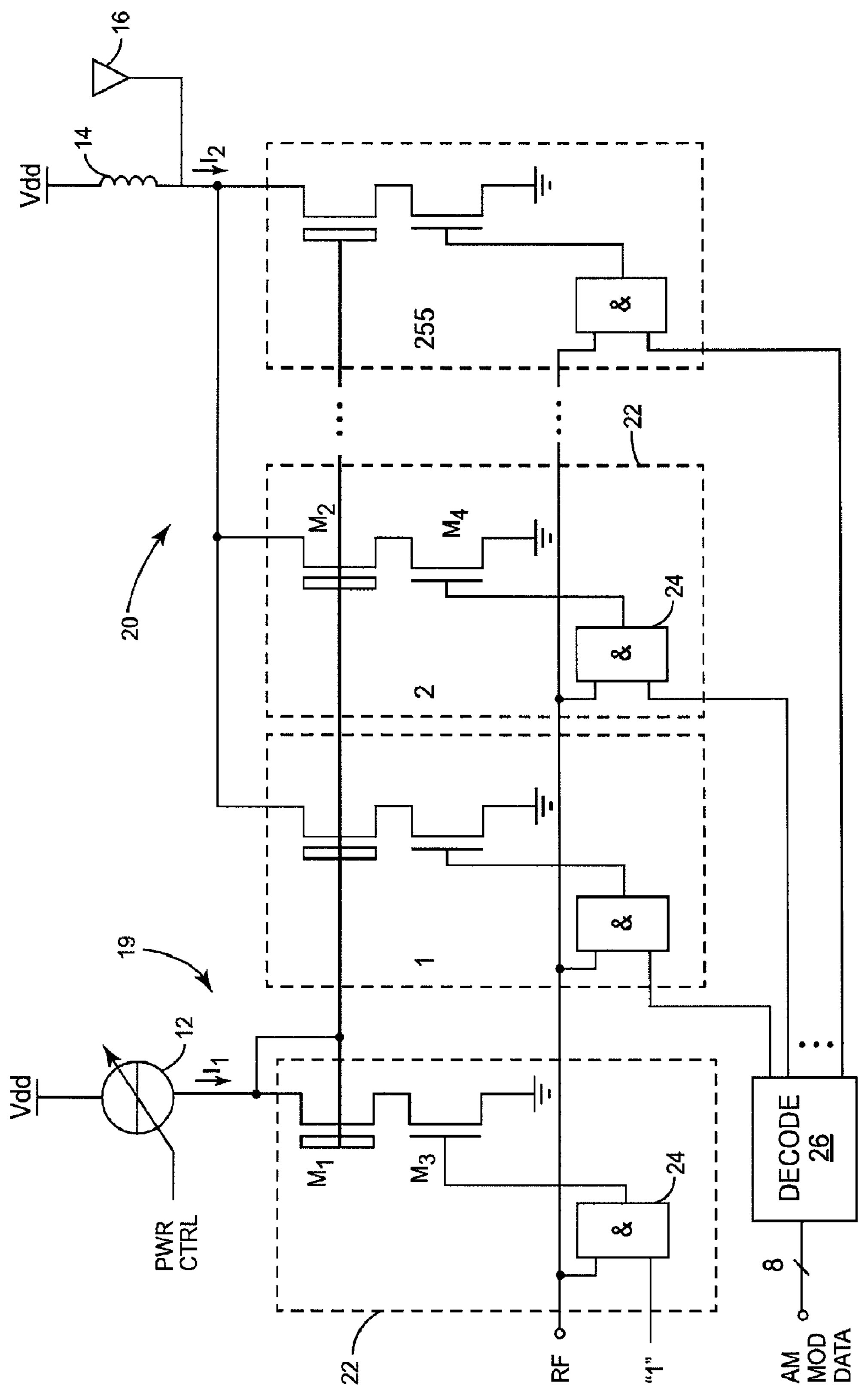
FIG. 4 is a functional schematic diagram of a current mirror circuit having a plurality of output transistor cells and improved matching, according to one embodiment of the present invention.

FIG. 4 depicts a current mirror amplifier circuit having even greater matching, and hence more stable and predictable output current $I_2$. In this embodiment, the reference circuit 19 uses the same component-matched cell 22 as the parallel-connected output circuit 20. That is, the reference transistor $M_1$ and series-connected ground path switching transistor $M_3$ are not only closely matched to output transistors $M_2$ and ground path switching transistors $M_4$, respectively, but they are substantially identical. For example, the cells 22 are preferably instantiations of the same layout cell from a library. Additionally, the cell 22, and hence the reference circuit 19, includes the logic function 24. To enable the reference circuit 19 at all times, one input of the logic function 24 is tied to a static enabling value, such as a logical one in the case of an AND gate. This ensures that the RF switching signal applied to the gate of the reference ground path switching transistor $M_3$ exactly matches that applied to the ground path switching transistor $M_4$ of each enabled output cell 22 (e.g., substantially identical propagation delay, fan-out, drive strength, capacitive loading, and the like).

Figure 5:
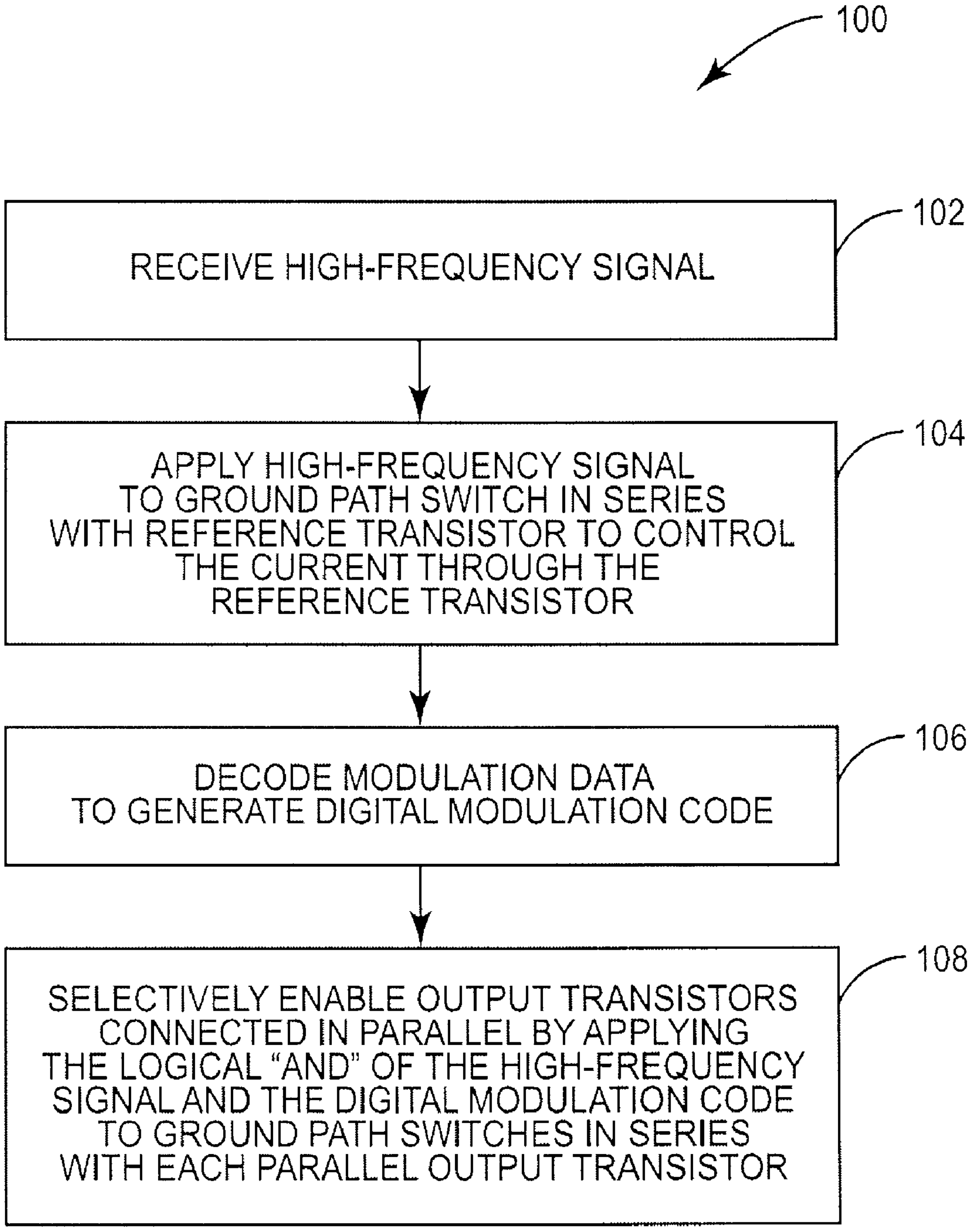
FIG. 5 is a flow diagram of a method of modulating a high-frequency signal in a current mirror circuit, according to one embodiment of the present invention.

FIG. 5 depicts a method 100 of modulating a high-frequency signal in a current mirror circuit. A high-frequency signal is received (block 102), such as a phase-modulated RF carrier signal. The high-frequency signal is applied to a ground path switch, such as a transistor configured to function as a switch, in series with a reference transistor, to control the current through the reference transistor (block 104). Digital modulation data, such as amplitude modulation data, is received and decoded, such as into thermometer-coded form (block 106). A plurality of output transistors, connected in parallel and each gate-connected to the reference transistor, are selectively enabled by applying a logical function, such as an AND, of the high-frequency signal and the decoded modulation data, to ground path switches, such as transistors configured to function as switches, in series with each output transistor, to control the current through the output transistors (block 108). The currents of the enabled output transistors, each of which is proportional to the current through the reference transistor, are then summed to form a modulated output current.

Current mirror circuits as disclosed herein exhibit superior current matching as compared to prior art current mirrors, without requiring any feedback mechanism. By switching both reference and output circuits of a current mirror with the same or closely related switching signals, variations in the switching signals, such as limited rise/fall times and unknown duty cycle, do not deleteriously affect current matching, as the same effects are realized in each side of the current mirror. By closely matching output cells with each other and with a reference circuit, and selectively enabling output cells via decoded modulation data, embodiments of the present invention realize a modulating amplifier having predictable, stable performance and efficient operation.

Those of skill in the art will readily realize that numerous variations on the inventive concepts taught herein are readily possible, and fall within the scope of the appended claims. For example, the logic function 24 may be implemented by any logic, including AND, NAND, OR, NOR, XOR, or XNOR functions, or combinations thereof, as required or desired, with corresponding logic levels generated by the decoder 26. Furthermore, the decoder 26 may decode modulation data to a representation other than thermometer-coded values. Additionally, while representative circuits herein have utility as amplifiers, it is clear from the disclosure that the same inventive principles could be applied to realize other circuit functionality, such as simple Digital to Analog Conversion (DAC). In general, the present invention may be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A high-frequency, modulating current mirror circuit, comprising:

a reference transistor diode-connected between an output power controller and a switched path to signal ground;

a plurality of output transistors connected in parallel between a common load and independent switched paths to signal ground, the gates of the output transistors all connected to the gate of the reference transistor;

a high-frequency input operative to receive a high-frequency signal;

a digital decoder operative to receive and decode a digital modulation code; and a plurality of logic functions corresponding to the plurality of output transistors, each logic function operative to receive the high-frequency signal and a bit of the decoded modulation code, the output of each logic function operative to control the respective ground path switch of an output transistor.

2. The circuit of claim 1 wherein the reference transistor and ground path switch, and each of the plurality of output transistors and ground path switches, are formed as component-matched cells.

3. The circuit of claim 1 wherein each logic function implements a logical AND function.

4. The circuit of claim 1 wherein the high-frequency signal comprises a radio frequency (RF) carrier signal.

5. The circuit of claim 4 wherein the RF carrier signal is phase-modulated.

6. The circuit of claim 1 wherein the digital modulation code comprises amplitude modulation data.

7. The circuit of claim 6 wherein the current mirror circuit implements a polar modulator.

8. The circuit of claim 1 wherein the high-frequency signal is operative to directly control the ground path switch of the reference transistor.

9. The circuit of claim 1 further comprising an additional logic function, implementing the same logic as the plurality of logic functions, operative to receive the high-frequency signal and a static enabling value, the output of the additional logic function operative to control the ground path switch of the reference transistor.

10. The circuit of claim 9 wherein the component-matched cells further include the respective logic functions.

11. The circuit of claim 1 wherein the decoded modulation code is a thermometer code.

12. A method of modulating a high-frequency signal in a current mirror circuit, comprising:

controlling a current through a diode-connected reference transistor by selectively coupling the transistor to signal ground via a switch controlled by a high-frequency signal; and selectively controlling the current through one or more of a plurality of output transistors connected in parallel and having a common load by selectively coupling one or more of the transistors to signal ground via respective switches controlled by the high-frequency signal and a digital modulation code, wherein the gates of the output transistors are all connected to the gate of the reference transistor.

13. The method of claim 12 wherein the reference transistor, the output transistors, and their respective ground path switches are formed as component-matched cells.

14. The method of claim 12 wherein selectively controlling the current through some of the output transistors comprises directly controlling the ground path switches with the output of a logical operation applied on the high-frequency signal and digital modulation code.

15. The method of claim 14 wherein the logical operation is a logical AND function.

16. The method of claim 12 further comprising receiving digital modulation data and decoding the data to generate a digital modulation code.

17. The method of claim 16 wherein the digital modulation code is a thermometer code.

18. The method of claim 12 wherein controlling a current through a diode-connected reference transistor by selectively coupling the transistor to signal ground via a switch controlled by a high-frequency signal comprises directly controlling the ground path switch with the high-frequency signal.

19. The method of claim 12 wherein controlling a current through a diode-connected reference transistor by selectively coupling the transistor to signal ground via a switch controlled by a high-frequency signal comprises controlling the ground path switch with the output of the logical operation applied on the high-frequency signal and a static enabling signal.

20. The method of claim 19 wherein the logical operation is a logical AND function and the static enabling signal is a logical "1".

21. The method of claim 19 wherein the component-matched cells further include circuits implementing the logical operation.

22. The method of claim 12 wherein the high-frequency signal is a phase modulated radio frequency (RF) signal.

* * * * *